(12) United States Patent
Colombo et al.

(10) Patent No.: US 7,387,956 B2
(45) Date of Patent: Jun. 17, 2008

(54) REFRACTORY METAL-BASED ELECTRODES FOR WORK FUNCTION SETTING IN SEMICONDUCTOR DEVICES

(75) Inventors: Luigi Colombo, Dallas, TX (US); James J Chambers, Dallas, TX (US); Mark R Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/462,573

(22) Filed: Aug. 4, 2006

(65) Prior Publication Data

US 2006/0267119 A1 Nov. 30, 2006

Related U.S. Application Data

(62) Division of application No. 10/852,523, filed on May 24, 2004, now Pat. No. 7,098,516.

(51) Int. Cl.
*H01L 21/3205* (2006.01)
(52) U.S. Cl. ............... 438/592; 438/197; 257/412; 257/388; 257/407; 257/E21.006
(58) Field of Classification Search ............ 438/231, 438/153, 275, 197, 592, 720; 257/412, 388, 257/407
See application file for complete search history.

(56) References Cited

U.S. PATENT DOCUMENTS 6,642,094 B2  11/2003  Rotondaro et al.

2004/0207023 A1 * 10/2004  Nishiyama et al. .......... 257/371
2004/0256679 A1   12/2004  Hu
2005/0101134 A1 *  5/2005  Brask et al. .................. 438/689

OTHER PUBLICATIONS

Jaehoon Lee et al., "Tunable Work Function Dual Metal Gate Technology for Bulk and Non-Bulk CMOS," IEEE, 2002, pp. 359-362.
D. G. Park et al., "Thermally robust dual-work function ALD-MNx MOSFETs using conventional CMOS process flow," IEEE, 2004 Symposium on VLSI Technology, Digest of Technical Papers, pp. 186-187.
H. Y. Yu et al., "Thermally Robust High Quality HfN/HfO2 Gate Stack for Advanced CMOS Devices," IEEE, 2003.

* cited by examiner

*Primary Examiner*—Evan Pert
*Assistant Examiner*—Tan N Tran
(74) *Attorney, Agent, or Firm*—Jacqueline J. Garner; W. James Brady, III; Frederick J. Telecky, Jr.

(57) ABSTRACT

The present invention provides, in one embodiment, a gate structure (100). The gate structure comprises a gate dielectric (105) and a gate (110). The gate dielectric includes a refractory metal and is located over a semiconductor substrate (115). The semiconductor substrate has a conduction band and a valence band. The gate is located over the gate dielectric and includes the refractory metal. The gate has a work function aligned toward the conduction band or the valence band. Other embodiments include an alternative gate structure (200), a method of forming a gate structure (300) for a semiconductor device (301) and a dual gate integrated circuit (400).

7 Claims, 10 Drawing Sheets

REFRACTORY METAL-BASED ELECTRODES FOR WORK FUNCTION SETTING IN SEMICONDUCTOR DEVICES

This is a divisional application of Ser. No. 10/852,523 filed May 24, 2004 now U.S. Pat No. 7,098,516.

TECHNICAL FIELD OF THE INVENTION

The present invention is directed in general to semiconductor devices and the manufacture of semiconductor devices and, more specifically, to manufacturing gate structures for semiconductor devices.

BACKGROUND OF THE INVENTION

The ability to dope polysilicon gates to different degrees allows one to adjust the work function of gate electrode materials to particular types of metal oxide silicon (MOS) transistors. It is desirable to adjust the work function of a gate electrode (hereinafter, the gate), to be close to either the conduction band or the valence band of silicon, because this reduces the threshold voltage ($V_t$) of the transistor, thereby facilitating a high drive current. For instance, dual work function gates are advantageously used in semiconductor devices, such as complementary metal oxide silicon (CMOS) transistor device, having both pMOS and nMOS transistors. The use of doped polysilicon gates becomes problematic, however, as the dimensions of gates and gate insulators are reduced.

Polysilicon gates can accommodate only a finite amount of dopants. This limitation can result in a depletion of gate charge carriers at the interface between the gate and gate dielectric, when the gate is biased to invert the channel. Consequently, the electrical thickness of the gate stack is substantially increased, thereby deteriorating the performance characteristics of the transistor, such as reducing the drive current and slowing switching speeds. For instance, the effective electrical thickness of a gate dielectric in some pMOS transistors can increase from about 1.0 nanometer during accumulation mode, to about 1.8 nanometers during inversion mode. Depletion of the polysilicon gate is a fundamental issue that limits further scaling of MOS devices.

In addition, when high-k gate dielectrics are used with polysilicon a Vt offset of up to 700 mV is observed for pMOS devices. This offset is associated with dopant, boron, diffusion and interaction with the gate dielectric. At present, there is no effective way to control for this $V_t$ offset problem.

Metal gates are an attractive alternative to polysilicon because they have a larger supply of charge carriers than doped polysilicon gates. When a metal gate is biased to invert the channel, there is no substantial depletion of carriers at the interface between the metal gate and gate dielectric. Accordingly, the transistor's performance is not deteriorated because the electrical thickness of the gate stack is not increased. The manufacture of semiconductor transistors having adjustable dual work function metal gates has been troublesome, however.

Ideally, dual work function metal gates should be compatible with conventional gate dielectric materials and have suitably adjustable and stable work functions. It is challenging, however, to find such metals. For instance, there have been attempts to use fully nickel silicided polysilicon as the gate for MOS transistors, with implanted dopants used to adjust the work function. During the annealing process to fully silicide the gate, however, the implanted dopants can interact with the gate dielectric. This can result in the same type of $V_t$ offset problem encountered for doped polysilicon. There is also the potential for nickel atoms to migrate into the gate dielectric and channel, thereby introducing defects that can degrade the performance, reliability, and stability of the device over time.

Others have attempted to use a hafnium nitride gate on a hafnium oxide gate dielectric. Such a gate has a mid-gap work function, meaning that the work function is about mid-way between the valence band and the conduction band of the substrate. Such mid-gap materials are unsatisfactory in a CMOS device, or other settings, where it is desirable to adjust the work function, in order to achieve a low $V_t$.

Accordingly, what is needed in the art is a method of manufacturing semiconductor devices having adjustable and stable metal electrodes.

SUMMARY OF THE INVENTION

To address the above-discussed deficiencies of the prior art, one embodiment is directed to a gate structure. The gate structure comprises a gate dielectric and a gate. The gate dielectric includes a refractory metal and is located over a semiconductor substrate. The semiconductor substrate has a conduction band and a valence band. The gate is located over the gate dielectric, includes the refractory metal and has a work function aligned toward the conduction band or the valence band.

Yet another embodiment is directed to an alternative gate structure. The alternative gate structure includes a gate dielectric located over a semiconductor substrate, the gate dielectric including a refractory metal. The alternative gate structure further includes a gate located over the gate dielectric and including the refractory metal, wherein the refractory metal excludes hafnium.

Still another embodiment provides a method of forming a gate structure for a semiconductor device. The method comprises forming a gate dielectric located over a semiconductor substrate having a conduction band and a valence band, the gate dielectric including a refractory metal. The method further includes forming a gate located over the gate dielectric having the refractory metal, and including aligning a work function of the gate toward the conduction band or the valence band.

Yet another embodiment is directed to a dual gate integrated circuit. The integrated circuit includes first and second gate structures, each comprising a gate dielectric and a gate. The gate of the first gate structure has a work function aligned toward the conduction band, and the gate of the second gate structure has a work function aligned toward the valence band. The integrated circuit also includes interconnect metal lines on one or more insulating layers located over the first and second gate structures. The interconnect metal lines interconnect the first and second gate structures to form an operative integrated circuit.

The foregoing has outlined preferred and alternative features of the present invention so that those of ordinary skill in the art may better understand the detailed description of the invention that follows. Additional features of the invention described hereinafter can also form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention recognizes the advantageous use of metal gate structures used in semiconductor devices that include a refractory metal-based gate and a refractory metal-based gate dielectric. In particular, it is desirable for the gate and gate dielectric to comprise the same refractory metal. For the purposes of the present invention, a refractory metal is defined as any element in Groups 4-6 and Periods 4-6 of the Periodic Table of Elements, as well as elements in the Lanthanide and Actinide series (International Union of Pure and Applied Chemist Convention for designating Groups and Periods). While not limiting the scope of the present invention by theory, it is believed that using the same refractory metal for the gate and gate dielectric is advantageous because it minimizes the presence of electrical dipoles at the interface between the gate and gate dielectric. This, in turn, facilitates sufficient work function control of the gate to enable semiconductor devices to be constructed with lower voltage thresholds than hitherto obtainable.

Figure 1:
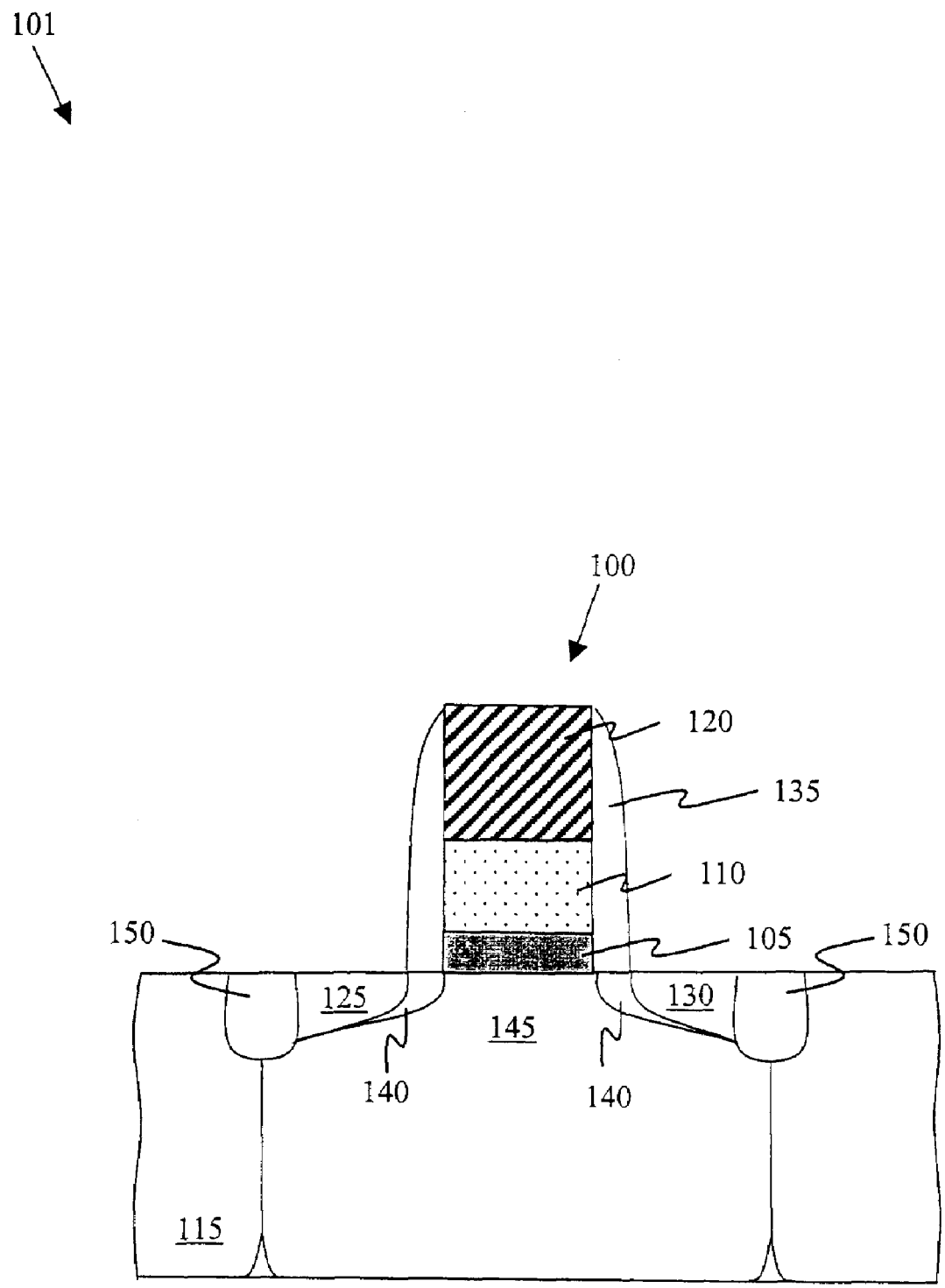
FIG. 1 illustrates a sectional view of an exemplary gate structure manufactured according to the principles of the present invention.

One embodiment of the present invention, illustrated in FIG. 1, is a gate structure 100. Preferably, the gate structure 100 is included in a MOS semiconductor device 101, such as a pMOS or nMOS transistor, or in a CMOS transistor device. The gate structure 100 includes a gate dielectric 105 and a gate 110. The gate dielectric 105 include a refractory metal, and is located over, and preferably on, a semiconductor substrate 115. The gate 110 includes the same refractory metal that is in the gate dielectric 105 and is located over, and preferably on, the gate dielectric 105.

In some advantageous embodiments, the semiconductor substrate 115 is made of silicon, although other conventional substrate materials, such as, silicon-on-insulator, gallium arsenide, germanium, and silicon-germanium substrates etc . . . , are also within the scope of the invention. As well understood by those skilled in the art, regardless of the type of material used, the semiconductor substrate 115 has a conduction band and a valence band.

The gate 110 has a work function that is aligned toward the conduction band or the valence band semiconductor substrate 115. The term, work function, is defined as the minimum energy required to bring an electron from the Fermi level to the vacuum level. The term, aligned toward the conduction band, is defined as adjusting a gate work function to a value that is below about 4.6 eV. Similarly, the term, aligned toward the valence band, is defined as adjusting a gate work function to a value above about 4.8. The term, mid-gap work function, is defined as a gate work function ranging between 4.6 and 4.8 eV.

One of ordinary skill in the art would understand that the energy levels corresponding to the valance and conduction bands, and mid-gap work function, cited in the previous paragraph refer to exemplary embodiments where the semiconductor substrate 115 is silicon. Of course, these values would differ depending on the type of material used for the semiconductor substrate 115. Moreover, one skilled in the art would understand how to determine the specific energy level values for the semiconductor substrate 115 of interest, and align the gate toward the valence or conduction bands according to the principles of the present invention, or identify a gate having a mid-gap work function, as appropriate.

With continuing reference to FIG. 1, in some preferred embodiments, the refractory metal of the gate dielectric 105 and the gate 110 is a Group 4 metal, and more preferably, hafnium. In other preferred embodiments, however, the refractory metal is zirconium. In still other preferred embodiments, the refractory metal of the gate dielectric 105 and gate 110 is a Group 5 metal, and more preferably, tantalum. In yet other preferred embodiments, refractory metal of the gate dielectric 105 and gate 110 is a Group 6 metal, and more preferably, chromium.

In some embodiments, it is advantageous to further include nitrogen, oxygen, or mixtures thereof, to adjust the physical or electrical properties of the gate dielectric 105. For instance, in some embodiments, the gate dielectric 105 is preferably a high k dielectric material, that is, a material having a dielectric constant of greater than about 4, and more preferably between about 6 and about 20. In other embodiments, it is desirable to adjust the physical or electrical properties of the gate 110 by including nitrogen in the gate 110. In some instances, for example, where the semiconductor substrate 115 is silicon, and the refractory metal is hafnium, the gate 110 is preferably hafnium nitride, and the gate dielectric 105 is preferably hafnium oxynitride. As another example, in embodiments where the semiconductor substrate 115 is silicon, and the refractory metal is zirconium, then the gate dielectric 105 is preferably zirconium oxynitride or zirconium oxide, and the gate 110 is preferably zirconium nitride.

Certain combinations of materials for the gate dielectric 105 and the gate 110 are excluded, however, when such materials would result in the gate 110 having a mid-gap work function. Such combinations of materials are excluded because the gate work function cannot be adjusted towards the valance or conduction band. An example of such an excluded combination, where the semiconductor substrate 115 is silicon, is a gate dielectric 105 is made of hafnium oxide and a gate 110 is made of hafnium nitride.

In some cases, at least one other element, preferably a non-refractory metal, is combined with the refractory metal to form an alloy, thereby adjusting the gate work function. For instance, the formation of an aluminum alloy with the refractory metal can advantageously result in the gate 110 having a fermi level that is aligned nearer to the silicon substrate's 115 valence band than the refractory metal alone, resulting in the gate 110 being more desirable for use in an pMOS transistor (e.g., the gate work function of greater than about 4.8 eV, and more preferably between about 4.9 and about 5.0 eV).

Analogous to the above discussion, the formation of an silicon alloy with the refractory metal can advantageously result in the gate 110 having a fermi level that is aligned nearer to the silicon substrate's 115 conduction band as compared to the refractory metal alone, resulting in the gate 110 being more desirable for use in an nMOS transistor 101 (e.g., the gate work function decreased to less than about 4.6 eV, and more preferably, between about 4.2 and about 4.3 eV).

Some preferred embodiments of the gate 110 thus comprise a compound including at least three elements, including the refractory metal. Certain preferred embodiments of the compound include silicon and nitrogen, or aluminum and nitrogen. Consider one example, where the semiconductor device 101 is an nMOS transistor on a silicon semiconductor substrate 115. The gate dielectric 105 is preferably hafnium oxynitride or hafnium siliconoxynitride, and the gate 110 is preferably hafnium silicon nitride. In another advantageous embodiment, where the semiconductor device 101 is a pMOS transistor on a silicon semiconductor substrate 115, the gate dielectric 105 is hafnium oxynitride or hafnium silicon oxynitride and the gate 110 is hafnium aluminum nitride. Of course, the semiconductor device 101, can include a plurality of different gate structures 100 that are each appropriate for individual nMOS or pMOS transistors, a CMOS device, or other active devices.

In other embodiments of the gate structure 100, the gate the work function is adjusted by adding one or more dopants to the gate 110. For instance, some preferred embodiments of the gate 110 further include n-type dopants or p-type dopants. In some cases, implanted n-type dopants, such as arsenic or phosphorus, align the fermi level of the gate 110 towards the semiconductor substrate's conduction band, such as when the desired semiconductor device 101 is an nMOS transistor. For instance, for a silicon substrate 115, the work function of the n-type dopant-implanted gate 110 can have a work function of less than about 4.6 eV, and more preferably, between about 4.3 and about 4.2 eV. Alternatively, one can implant p-type dopants, such as boron, to align the fermi level of the gate 110 towards the valence band of the semiconductor substrate 115, when the desired semiconductor device 101 is a pMOS transistor. Consequently, for a silicon substrate 115, the work function of the p-type dopant-implanted-gate 110 is greater than about 4.8 eV, and more preferably, between about 4.9 and about 5.0 eV.

In yet other embodiments of the gate structure 100, the work function of the gate 110 can be adjusted towards the valance or conduction band of the semiconductor substrate 115 by both implanting dopants and forming an alloy, as described above. As illustrated in FIG. 1, still other embodiments of the gate structure 100 further include a conductive material 120, such as a metal or doped polysilicon, on the gate 110 to form a stacked gate. Of course, one skilled in the art would understand that various other conventional components can be added to complete the semiconductor device 101, including source and drain structures 125, 130, gate sidewalls 135, shallow junctions 140, a channel region 145 and shallow trench isolation structures 150.

Figure 2:
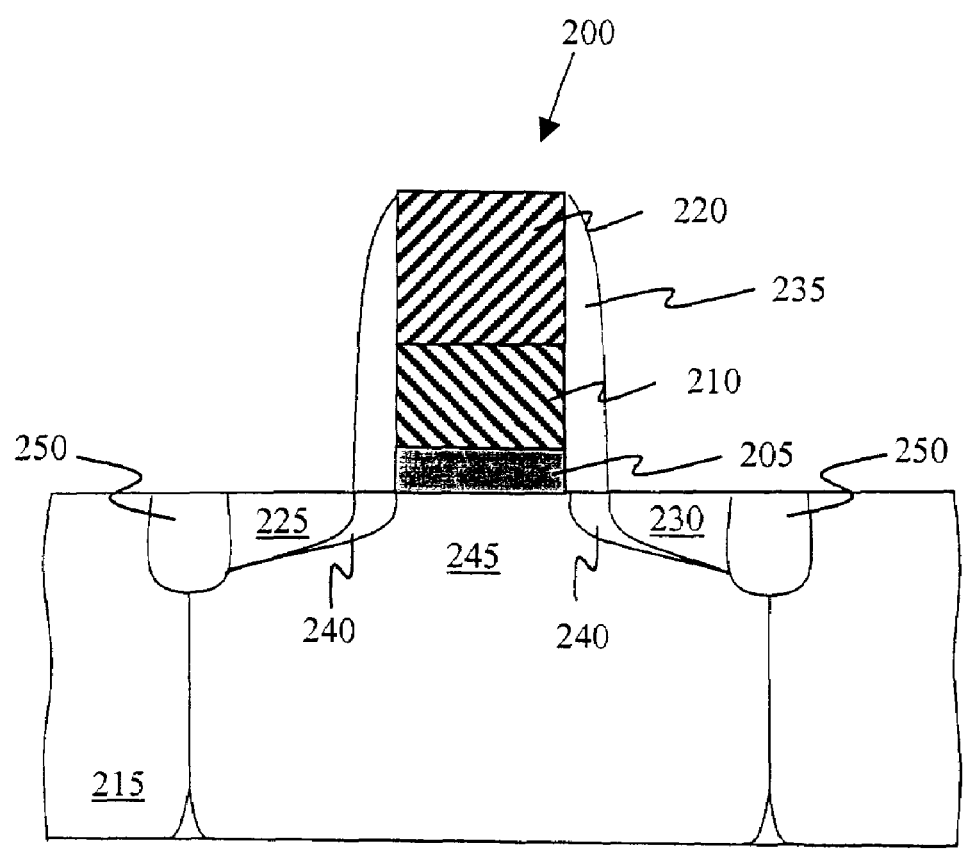
FIG. 2 illustrates a sectional view of an alternative exemplary gate structure manufactured according to the principles of the present invention.

Another embodiment of the present invention is illustrated in FIG. 2, an alternative gate structure 200. Analogous structures to that shown in FIG. 1 are represented by analogous reference numbers. A gate dielectric 205 is located over a semiconductor substrate 215, the gate dielectric 205 including a refractory metal. A gate 210 is located over the gate dielectric 205 and also includes the refractory metal.

Unlike the gate structure 100 shown in FIG. 1, however, the refractory metal of the gate dielectric 205 and gate 210 excludes hafnium. It can be advantageous to exclude hafnium in instances when hafnium is not compatible with other components in the semiconductor device 201, when there would be defects at the interface between the semiconductor substrate 215 and a hafnium-based gate dielectric, or when a hafnium-based gate would have a mid-gap work function.

Other than the refractory metal excluding hafnium, the alternative gate structure 200 can include any of the embodiments of the gate structure 100 shown in FIG. 1. For instance, in some embodiments of the gate structure 200, the gate dielectric 205 is preferably a high k dielectric material. Certain preferred embodiments of the gate dielectric 205 can include nitrogen, oxygen or mixtures thereof. Similarly, some preferred embodiments of the gate 210 can include nitrogen. The work function of the gate 210 can also be aligned towards the conduction or valence band of the substrate as appropriate, in similar fashion to that discussed above. Thus, in some embodiments, the refractory metal in the gate 210 can be alloyed with at least one other element, such as aluminum or silicon, doped with a p-type or n-type dopant, or both alloyed and doped. In some cases, the gate 210 is a compound that has at least three elements, including the refractory metal. Examples include the refractory metal plus silicon and nitrogen, or the refractory metal plus aluminum and nitrogen.

Still another embodiment of the present invention is illustrated in FIG. 3A-3G, a method for forming a gate structure 300 for a semiconductor device 301. Any of the embodiments of the gate structure 100, 200 described above in the context of FIGS. 1 and 2, can be used in the method depicted in FIGS. 3A to 3G, or in other embodiments of the method.

Figure 3A:
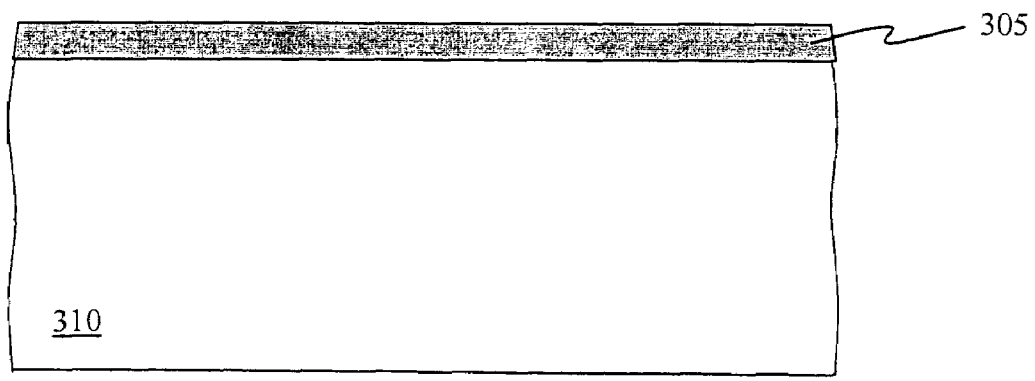
FIGS. 3A to 3G illustrate sectional views of selected steps in an exemplary method of forming a gate structure for a semiconductor device according to the principles of the present invention.

Turning first to FIG. 3A, illustrated is the partially completed gate structure 300 after forming a gate dielectric layer 305 located over, and preferably on, a semiconductor substrate 310 having a conduction band and a valence band, the gate dielectric layer 305 including a refractory metal. Any conventional technique can be used to form the gate dielectric layer 305, including atomic layer deposition (ALD), physical vapor deposition (PVD), chemical vapor deposition (CVD), and spin coating, or other procedures well known to those skilled in the art.

Figure 3B:
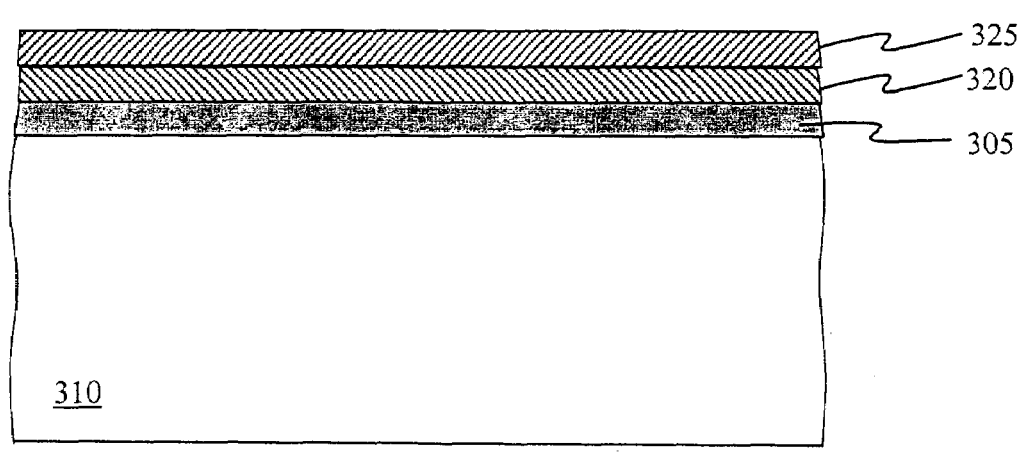
Figure 3C:
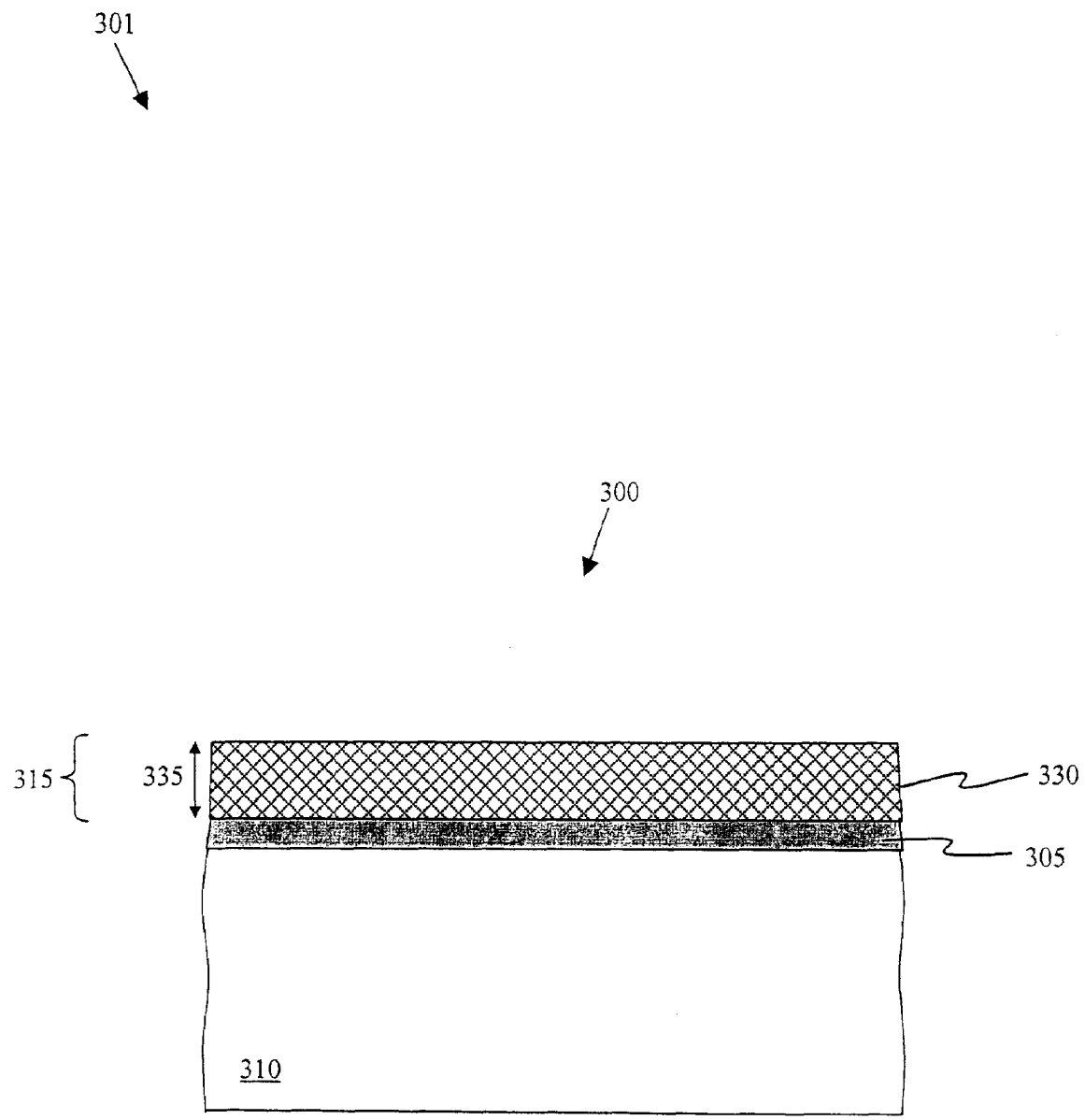
Figure 3D:
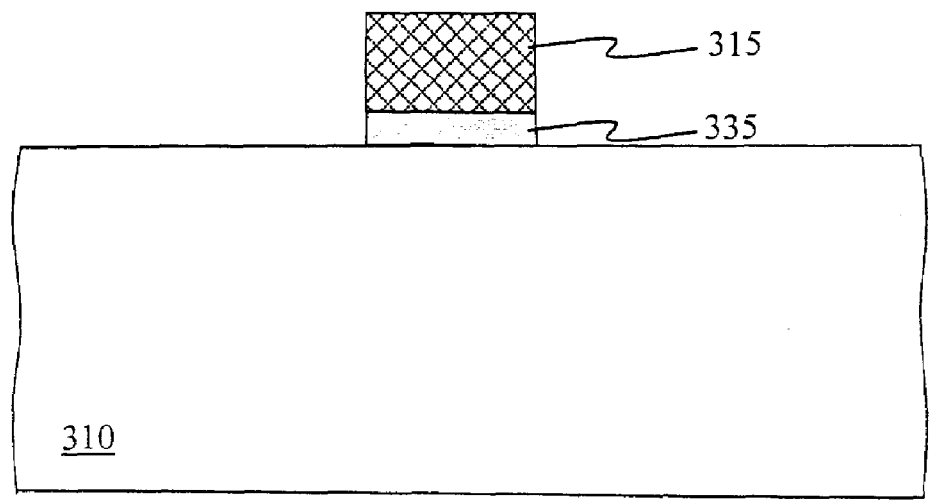

As noted above, forming the gate includes aligning a work function of the gate toward the conduction band or the valence band of the semiconductor substrate 310. FIGS. 3B-3D illustrate different stages in an exemplary process for forming a gate 315 by forming an alloy. Turning now to FIG. 3B, shown is the partially completed gate 315 after depositing a metal layer 320 over, and preferably on the gate dielectric layer 305, and depositing a material layer 325 over, and preferably on, the metal layer 325. Conventional techniques, similar to that used to form the gate dielectric layer 305, can be used to deposit the metal layer 320 and the material layer 325. The metal layer 320 contains the same refractory metal as in the gate dielectric layer 305. In addition to the refractory metal, the metal layer 320 can further include another element, such as nitrogen. The material layer 325 contains an element, preferably a non-refractory metal element, such as aluminum or silicon.

With continuing reference to FIG. 3B, FIG. 3C depicts the partially completed gate 315 after annealing the metal layer 320 and the material layer 325 together to form an alloy layer 330, thereby aligning the work function. In some advantageous embodiments, forming the alloy includes heating the metal layer 320 and the material layer 325 to a temperature of between about 600° C. and 1400° C., for a period of least about 1 second. In certain preferred embodiments, the alloy layer 330 has a thickness 335 of at least about 1 nanometer. Preferably, the refractory metal of the metal layer 325 and the element of the material layer are homogeneously mixed in the alloy layer 330. In instances where the metal layer includes another element, the alloy layer 330 is a ternary compound, where the refractory metal forms a portion thereof. Thus, in some advantageous cases, the alloy layer 330 includes the refractory metal plus silicon and nitrogen, or the refractory metal plus aluminum and nitrogen. Turning now to FIG. 3D, illustrated is the partially completed gate structure 300 after using conventional patterning techniques to form the gate 315, and the gate dielectric 335.

Figure 3E:
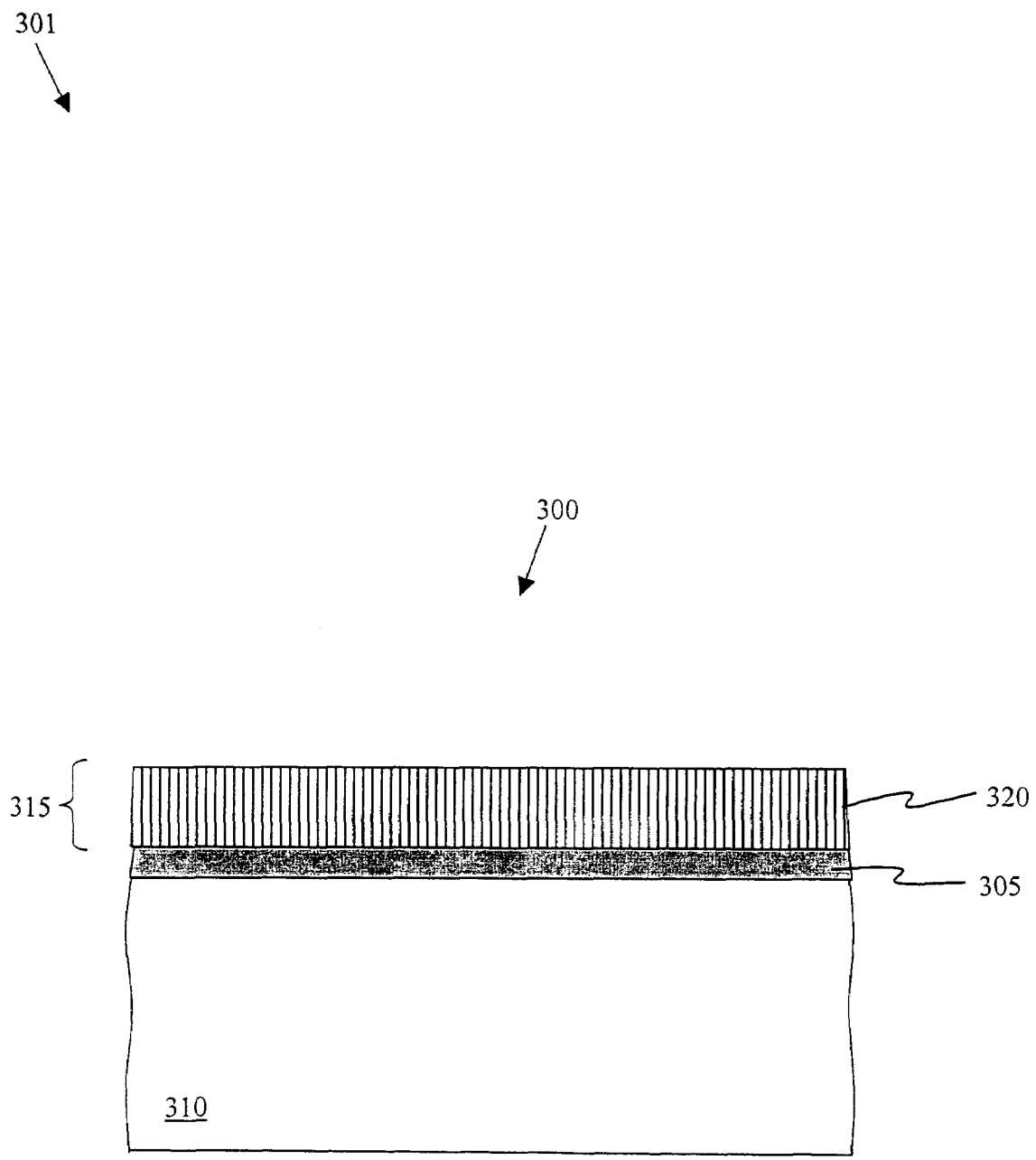
Figure 3F:
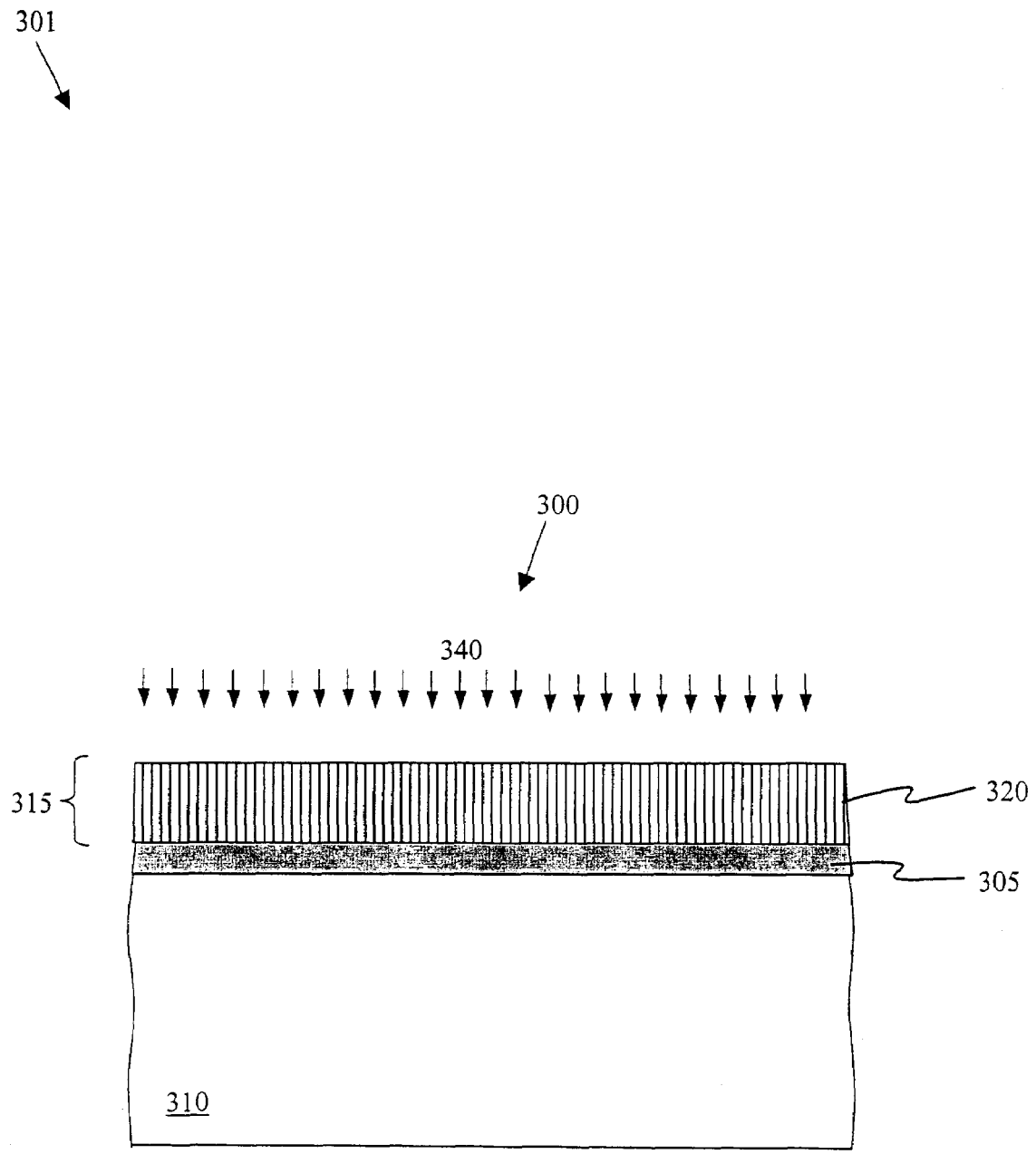
Figure 3G:
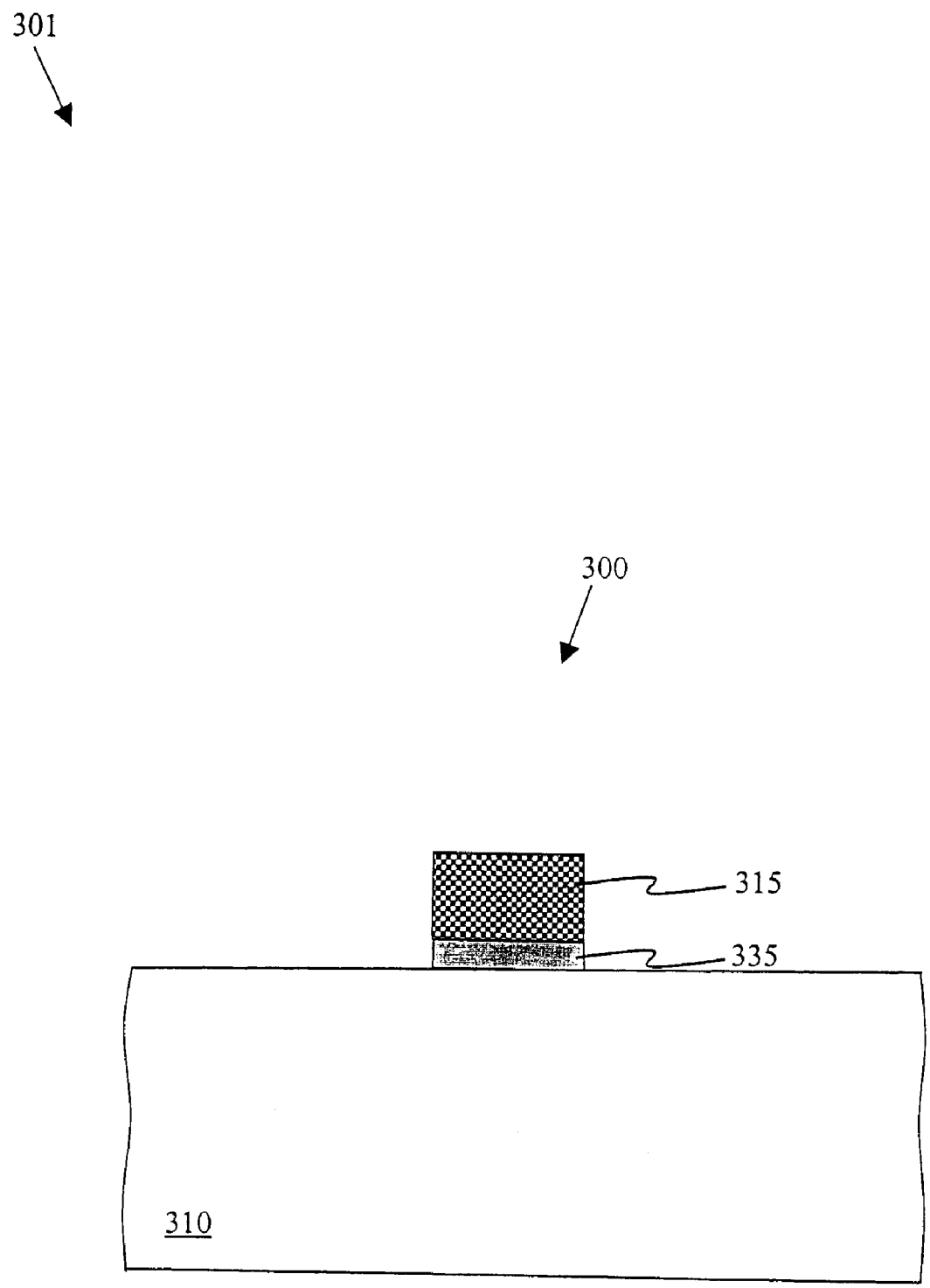

FIGS. 3E-3G illustrate an alternative means to align the work function by including a dopant in the gate 315. Turning now to FIG. 3E, shown is the partially completed gate 315 after forming a metal layer 320 over, and preferably on, the gate dielectric layer 305 of FIG. 3A. The metal layer 320 includes the same refractory metal as in the gate dielectric layer 305, and can include additional elements such as nitrogen. With reference now to FIG. 3F, illustrated is the partially completed gate dielectric layer 305 during the implantation of the metal layer 320 with dopants (represented by arrow 340), such n-type or p-type dopants, thereby aligning the work function. Of course, implanting can be followed by conventional thermal annealing procedures to drive the dopant throughout the metal layer 320. Referring now to FIG. 3G, presented is the partially completed gate structure 300 after using conventional patterning techniques to form the gate 315 and the gate dielectric 335.

One skilled in the art would understand that a wide variety of alternative processing methods could be used to form the gate 315. For example, in some embodiments, forming the gate 315 can include forming an alloy, similar to that illustrated in FIGS. 3C-3D, following by dopant implantation such as illustrated in FIG. 3F. In other embodiments forming the gate 315 can include forming a doped metal layer 320, such as illustrated in FIG. 3E-3F, followed by forming an alloy, similar to that illustrated in FIGS. 3C-3D.

Of course, various additional conventional steps, well known to those skilled in the art, can be performed to complete the fabrication of the gate structure 300, similar to that discussed above in the context of FIG. 1. Such step can include, but are not limited to, forming a conductive layer over the gate to form a stacked gate or forming gate side-wall structures. Similarly, conventional procedures can be performed to complete the fabrication of the semiconductor device 301, including constructing source and drain structures, shallow junctions, a channel region and shallow trench isolation structures, to form an active device.

Figure 4:
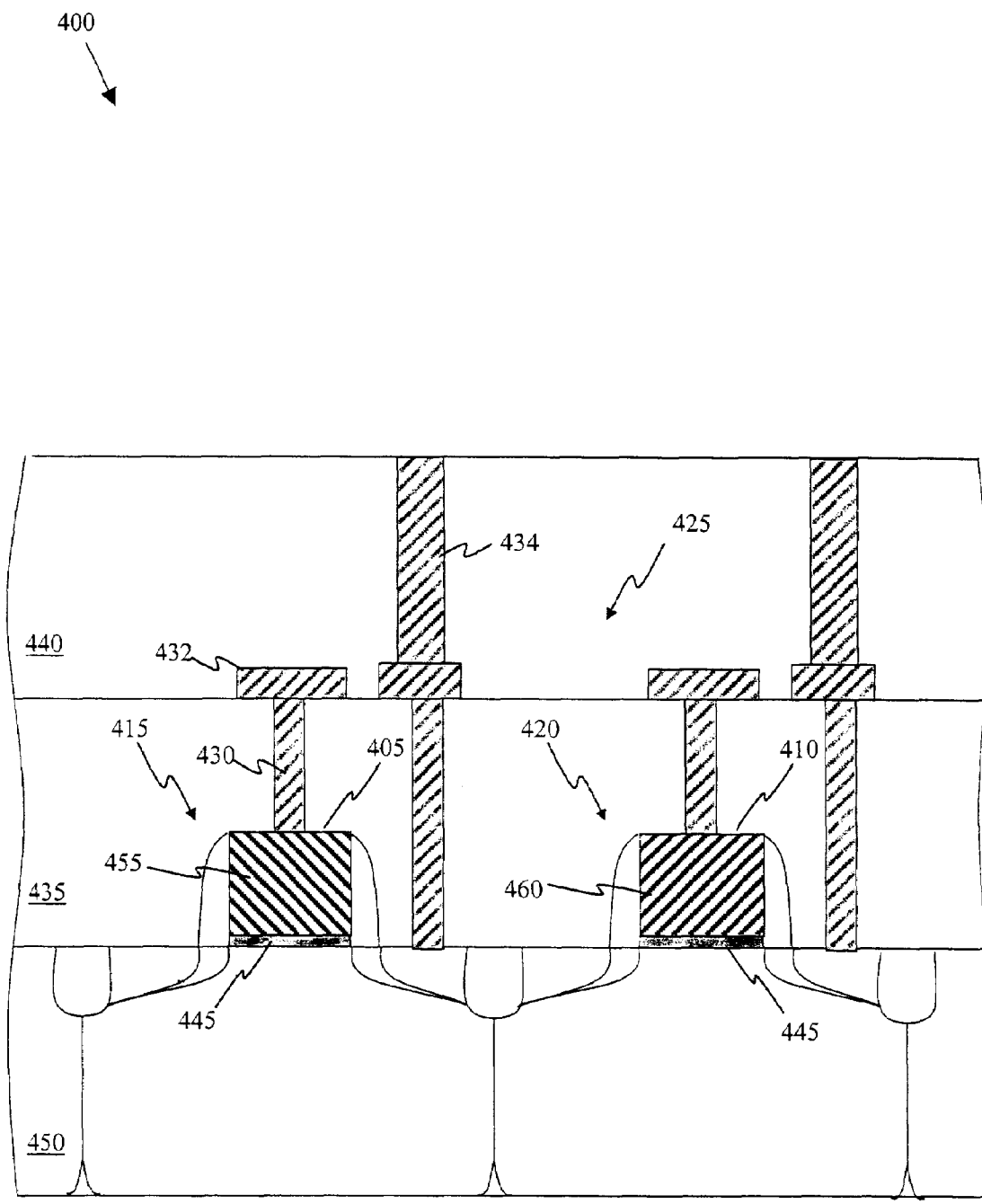
FIG. 4 illustrates a sectional view of an exemplary dual gate integrated circuit manufactured according to the principles of the present invention.

FIG. 4 presents a cross-sectional view of yet another embodiment of the present invention, a dual gate integrated circuit 400. The exemplary dual gate integrated circuit 400 shown in FIG. 4, includes first and second gate structures 405, 410. In some preferred embodiments, the first and second gate structures, 405, 410 are included in first and second active devices, 415, 420 respectively. In some instances, the first and second active devices 415, 420 correspond to nMOS and pMOS transistors, respectively, that work in cooperation to form a CMOS device 425. The dual gate integrated circuit 400 also includes interconnect metals lines 430, 432, 434 on one of more insulating layers 435, 440 located over the first and second gate structures 405, 410 and interconnecting the first and second gate structures 405, 410 to form an operative integrated circuit.

The first and second gate structures 405, 410 can be formed according to any of the embodiments of the gate structures described above and shown FIGS. 1, 2 and 3A-3G. For instance, as illustrated in FIG. 4, the first and second gate structures 405, 410 can each comprise a gate dielectric 445 located over a semiconductor substrate 450 having a conduction band and a valence band, the gate dielectric 445 including a refractory metal. The first and second gate structures 405, 410 each have a gate 455, 460, located over the gate dielectric 445, and include the same refractory metal of the gate dielectric 445. The gate 455 of the first gate structure 405 has a work function aligned toward the conduction band of the substrate 450, while the gate 460 of the second gate structure 410 has a work function aligned toward the valence band of the substrate 450.

The work functions of the gates 455, 460 can be aligned by any of the above-described methods of forming an alloy or implanting dopants, or a combination thereof. For example, in some preferred embodiments, the refractory metal in the gate 455 of the first gate structure 405 is alloyed with a first element, and the gate 460 of second gate structure 410 is alloyed with a second element that is different from the first element. Preferably, the element is not a refractory metal, and more desirably is aluminum or silicon.

Other embodiments of the gates 455, 460 comprise a compound having at least three different elements therein, including the refractory metal. In some such embodiments the compound of the gate 455 for the first gate structure 405 is different than the compound comprising the gate 460 for the second gate structure 410. For instance, the gate 455 can be made of a compound that includes silicon and nitrogen, and the gate 460 can be made of a compound that includes aluminum and nitrogen.

The gate dielectric 445 preferably has a high dielectric constant. For example, gate dielectric 445 can be composed of a high k dielectric material. In some preferred embodiments the gate dielectric 445 includes nitrogen, oxygen or mixtures thereof. In one preferred combination, the gate is 455 composed of HfSiN, the second gate 460 is composed of HfAlN and the gate dielectric 445 composed of HfSiON, HfON or HfO$_2$. In another preferred combination, the gate 455 is made of ZrSiN, the gate 460 is made of ZrAlN, and the gate dielectric 445 made of ZrSiOn, ZrON or ZrO$_2$.

Although the present invention has been described in detail, one of ordinary skill in the art should understand that they can make various changes, substitutions and alterations herein without departing from the scope of the invention.

What is claimed is:

1. A method of forming a gate structure for a semiconductor device, comprising:
    forming a gate dielectric located over a semiconductor substrate having a conduction band and a valence band, said gate dielectric including a refractory metal; and
    forming a gate located over said gate dielectric and having said refractory metal, including aligning a work function of said gate toward said conduction band or said valence band, wherein forming said gate further includes:
        depositing a material layer on a metal layer, wherein said material layer contains a non-refractory metal element; and annealing said metal layer and said material layer to form an alloy layer to thereby align said work function.

2. The method recited in claim 1, wherein forming said gate includes forming at least a ternary compound and wherein said refractory metal forms a portion thereof.

3. The method recited in claim 1, wherein said alloy layer includes silicon and nitrogen, or aluminum and nitrogen.

4. A method of forming a gate structure for a semiconductor device, comprising:

forming a gate dielectric located over a semiconductor substrate having a conduction band and a valence band, said gate dielectric including a refractory metal and nitrogen; and forming a gate located over said gate dielectric and having said refractory metal and nitrogen, including aligning a work function of said gate toward said conduction band or said valence band.

5. The method recited in claim 4, wherein forming said gate dielectric includes forming a gate dielectric having a high dielectric constant.

6. The method recited in claim 5, where forming said gate dielectric further includes forming a compound containing said refractory metal, and nitrogen, oxygen or mixtures thereof.

7. The method recited in claim 4, further including implanting n-type dopants or p-type dopants into said gate.

* * * * *